United States Patent
Bushnaq et al.

(10) Patent No.: US 9,953,715 B2
(45) Date of Patent: Apr. 24, 2018

(54) LEVEL SHIFTER

(71) Applicant: Toshiba Memory Corporation, Minato-ku, Tokyo (JP)

(72) Inventors: Sanad Bushnaq, Yokohama Kanagawa (JP); Manabu Sato, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/454,852

(22) Filed: Mar. 9, 2017

(65) Prior Publication Data

US 2017/0345508 A1 Nov. 30, 2017

(30) Foreign Application Priority Data

May 24, 2016 (JP) .................. 2016-103566

(51) Int. Cl.
*G11C 16/30* (2006.01)
*G11C 16/26* (2006.01)
(Continued)

(52) U.S. Cl.
CPC ............. *G11C 16/26* (2013.01); *G11C 16/08* (2013.01); *G11C 16/10* (2013.01); *G11C 16/30* (2013.01)

(58) Field of Classification Search
CPC .................................................. G11C 16/30
See application file for complete search history.

(56) References Cited

U.S. PATENT DOCUMENTS

| | | | | |
|---|---|---|---|---|
| 5,790,459 | A | * | 8/1998 | Roohparvar ........... G11C 16/08 365/185.18 |
| 2002/0122334 | A1 | * | 9/2002 | Lee .................. G11C 29/12005 365/185.23 |

(Continued)

*Primary Examiner* — Hoai V Ho
*Assistant Examiner* — Jay Radke
(74) *Attorney, Agent, or Firm* — White & Case LLP (57) ABSTRACT

According to one embodiment, A level shifter includes a first circuit configured to generate a first signal, the first signal being inverted and delayed signal of a second signal, a NAND circuit including a first input terminal and a second input terminal, the second signal being input to the first terminal, the first signal being input to the second terminal, a first transistor, a first voltage being applied to a first terminal of the first transistor, a second terminal of the first transistor being connected to a third input terminal of the NAND circuit, a third signal which inverts the second signal being applied to a gate of the first transistor, a second transistor, a second voltage being applied to a first terminal of the second transistor, the second voltage being higher than the first signal, a gate of the second transistor being connected to an output terminal, a third transistor, the second voltage being applied to a first terminal of the third transistor, a second terminal of the third transistor being connected to a second terminal of the second transistor, the second signal being applied to a gate of the third transistor, and a fourth transistor, a first terminal of the fourth transistor being connected to the second terminal of the third transistor, a second terminal of the fourth transistor being connected to the output terminal, an output terminal of the NAND circuit being connected to a gate of the fourth transistor.

12 Claims, 7 Drawing Sheets

(51) Int. Cl.
  *G11C 16/08* (2006.01)
  *G11C 16/10* (2006.01)

(56) References Cited

U.S. PATENT DOCUMENTS

| | | | |
|---|---|---|---|
| 2007/0109862 A1* | 5/2007 | Kim | G11C 8/08 |
| | | | 365/185.19 |
| 2012/0081957 A1* | 4/2012 | Kim | G11C 11/5628 |
| | | | 365/185.2 |
| 2013/0077413 A1* | 3/2013 | Yano | G11C 16/08 |
| | | | 365/185.23 |

* cited by examiner

LEVEL SHIFTER

CROSS-REFERENCE TO RELATED APPLICATION

This application is based upon and claims the benefit of priority from Japanese Patent Application No. 2016-103566; filed May 24, 2016, the entire contents of which are incorporated herein by reference.

FIELD

Embodiments described herein relate generally to a level shifter.

BACKGROUND

In a semiconductor device, the level shifter which outputs required voltage according to an input signal may be used.

DETAILED DESCRIPTION

In general, according to an embodiment, there is provided a level shifter includes a first circuit configured to generate a first signal, the first signal being inverted and delayed signal of a second signal, a NAND circuit including a first input terminal and a second input terminal, the second signal being input to the first terminal, the first signal being input to the second terminal, a first transistor, a first voltage being applied to a first terminal of the first transistor, a second terminal of the first transistor being connected to a third input terminal of the NAND circuit, a third signal which inverts the second signal being applied to a gate of the first transistor, a second transistor, a second voltage being applied to a first terminal of the second transistor, the second voltage being higher than the first signal, a gate of the second transistor being connected to an output terminal, a third transistor, the second voltage being applied to a first terminal of the third transistor, a second terminal of the third transistor being connected to a second terminal of the second transistor, the second signal being applied to a gate of the third transistor, and a fourth transistor, a first terminal of the fourth transistor being connected to the second terminal of the third transistor, a second terminal of the fourth transistor being connected to the output terminal, an output terminal of the NAND circuit being connected to a gate of the fourth transistor.

Hereinafter, exemplary embodiments will be described with reference to the accompanying drawings. In the following description, a common reference numeral will be given to common portions in the drawings.

Description will now be given of a semiconductor memory device according to a first embodiment. Hereinafter, description will be given of a three-dimensional stack type NAND-type flash memory, in which memory cell transistors are three-dimensionally arranged on a semiconductor substrate, as an example of the semiconductor device including the level shifter of this first embodiment.

1. With Respect to Configuration 1.1 with Respect to Overall Configuration of Semiconductor Memory Device First, the overall configuration of the semiconductor memory device will be described with reference to FIG. 1. As illustrated in the drawing, a NAND-type flash memory 1 includes a memory cell array 10, a row decoder 11 (11-1 to 11-3), a driver circuit 12, a sense amplifier 13, a data latch 14, a voltage generation circuit 15, and a control circuit 16.

Figure 1:
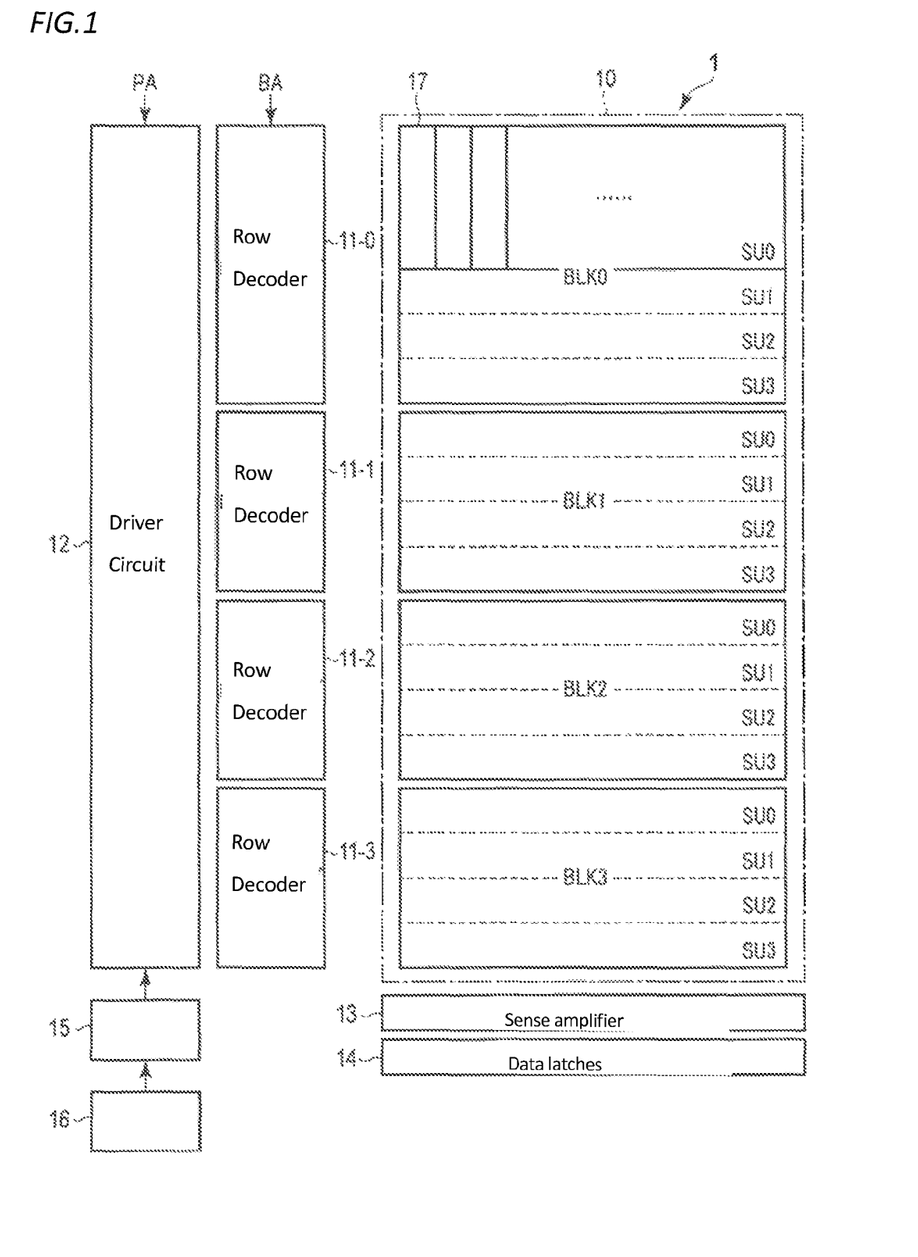
FIG. 1 is a block diagram of a semiconductor device equipped with the level shifter of a first embodiment.

The memory cell array 10 includes a plurality of blocks BLK (in this embodiment, the FIG. 1 shows only 4 blocks BLK0 to BLK3) including non-volatile memory cell transistors at intersections of rows and columns. For example, each of the blocks BLK includes four string units SU (SU0 to SU3). The number of the blocks in the memory cell array 7, and the number of the string units in each of the blocks are arbitrarily set.

The row decoders 11-0 to 11-3 correspond to the blocks BLK 0 to BLK 3 respectively. The row decoders 11-0 to 11-3 decodes a row address, and selects any one of the blocks BLK and any one of the string units SU on the basis of the decoding result. In addition, the row decoder 4 outputs a voltage, which is required, to the block BLK. For example, a row address is given from an external controller that controls the NAND-type flash memory.

The driver circuit 12 supplies voltages required for writing data, reading-out data, and erasing data, for example to the row decoder 11. These voltages are applied to a corresponding memory cell transistor through the row decoder 11.

During a data read operation, the sense amplifier 13 senses data that is read from the memory cell array 10. During a data write operation, the sense amplifier 13 transfers write data, which is received from the external controller, to the memory cell array 10.

During the data read operation, the data latch 14 temporarily stores data that is sensed in the sense amplifier 13, and transfers the sensed data to the external controller or a host device through an input and output circuit (not illustrated). In addition, during the data write operation, the data latch 14 temporarily stores write data that is input from the external controller or the host device through the input and output circuit, and transfers the write data to the sense amplifier 13.

The voltage generation circuit 15 generates voltages required for writing data, reading-out data, and erasing data and transfers these voltages to the driver circuit 12 for example.

The control circuit 16 controls the overall operation of the NAND-type flash memory 1.

1.2 with Respect to Configuration of Block BLK

Figure 2:
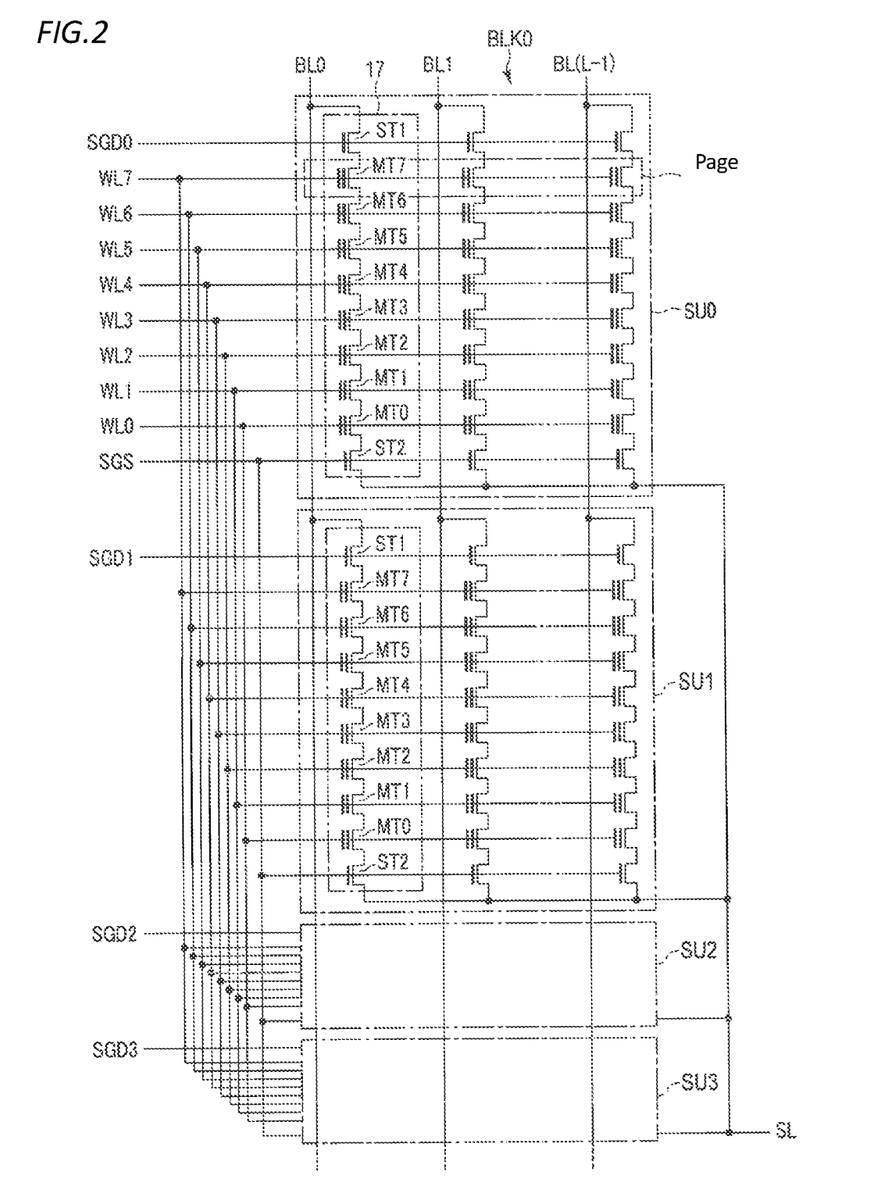
FIG. 2 is a circuit diagram of the memory cell array in the semiconductor device equipped with the level shifter of the first embodiment.

Next, the configuration of the block BLK will be described with reference to FIG. 2. FIG. 2 shows a circuit diagram of the block BLK 0. Circuit diagrams of the blocks BLK 1 to BLK3 are same as that of the block BLK 0. As described above, for example, the block BLK includes four string units SU, and each of the string units SU includes a plurality of NAND strings 17.

As illustrated in the drawing, for example, each of the NAND strings 17 includes eight memory cell transistors MT (MT0 to MT7), and select transistors ST1 and ST2. Each of the memory cell transistors MT includes a control gate and a charge storage layer, and retains data in a non-volatile manner. In addition, the memory cell transistors MT are connected to each other in series between a source of the select transistor ST1 and a drain of the select transistor ST2.

A gate of the select transistor ST1 in each of the string units SU0 to SU3 is connected to each of select gate lines SGD0 to SGD3. For example, the gate of the select transistor ST1 in the string unit SU0 is connected to the select gate line SGD0.

In contrast, for example, gates of the select transistors ST2 in the string units SU0 to SU3 are commonly connected to a select gate line SGS. Of course, in other examples, the gates of the select transistors ST2 may be respectively connected to select gate lines SGS0 to SGS3 different from each other for each string unit SU. In addition, control gates of the memory cell transistors MT0 to MT7 in the same block BLK are commonly connected to word lines WL0 to WL7, respectively. For example, the control gate of the memory cell transistor MT0 in the block BLK0 is connected to the word line WL0.

In addition, drains of the select transistors ST1 of the NAND strings 17 in each of the string units SU are respectively connected to bit lines BL (BL0 to BL(N−1) where N is a natural number of two or greater) which are different from each other. In addition, each of the bit lines BL commonly connects one NAND string 17 in each of the string units SU across the plurality of blocks BLK. In addition, sources of a plurality of the select transistors ST2 are commonly connected to a source line SL.

That is, each of the string units SU is an assembly of the NAND strings 17 which are respectively connected to the bit lines BL different from each other, and are connected to the same select gate line SGD. In addition, each of the blocks BLK is an assembly of a plurality of the string units SU which commonly use the word lines WL. In addition, the memory cell array 1 is an assembly of a plurality of the blocks BLK which commonly use the bit lines BL.

Furthermore, erasing of data can be performed in units of the block BLK, or in units that are smaller than the block BLK. Examples of the erasing method that may be employed are described in U.S. patent application Ser. No. 13/235,389, filed Sep. 18, 2011 with a title of "NONVOLATILE SEMICONDUCTOR MEMORY DEVICE," in U.S. patent application Ser. No. 12/694,690, filed Jan. 27, 2010 with a title of "NON-VOLATILE SEMICONDUCTOR STORAGE DEVICE," and in U.S. patent application Ser. No. 13/483,610, filed May 30, 2012 with a title of "NON-VOLATILE SEMICONDUCTOR MEMORY DEVICE AND DATA ERASE METHOD THEREOF" The entire contents of these patent applications are incorporated herein by reference.

In addition, the memory cell array 7 may have a configuration different from the above-described configuration. Example configurations of the memory cell array 7 that may be employed are described in U.S. patent application Ser. No. 12/407,403, filed Mar. 19, 2009 with a tile of "THREE-DIMENSIONAL STACKED NONVOLATILE SEMICONDUCTOR MEMORY," in U.S. patent application Ser. No. 12/406,524, filed Mar. 18, 2009 with a tile of "THREE DIMENSIONAL STACKED NONVOLATILE SEMICONDUCTOR MEMORY," in U.S. patent application Ser. No. 12/679,991, filed Mar. 25, 2010 with a title of "NON-VOLATILE SEMICONDUCTOR STORAGE DEVICE AND METHOD OF MANUFACTURING THE SAME," and in U.S. patent application Ser. No. 12/532,030, filed Mar. 23, 2009 with a title of "SEMICONDUCTOR MEMORY AND METHOD FOR MANUFACTURING SAME". The entire contents of these patent applications are incorporated herein by reference.

1.3 with Respect to Configuration of the Row Decoder 11

Figure 3:
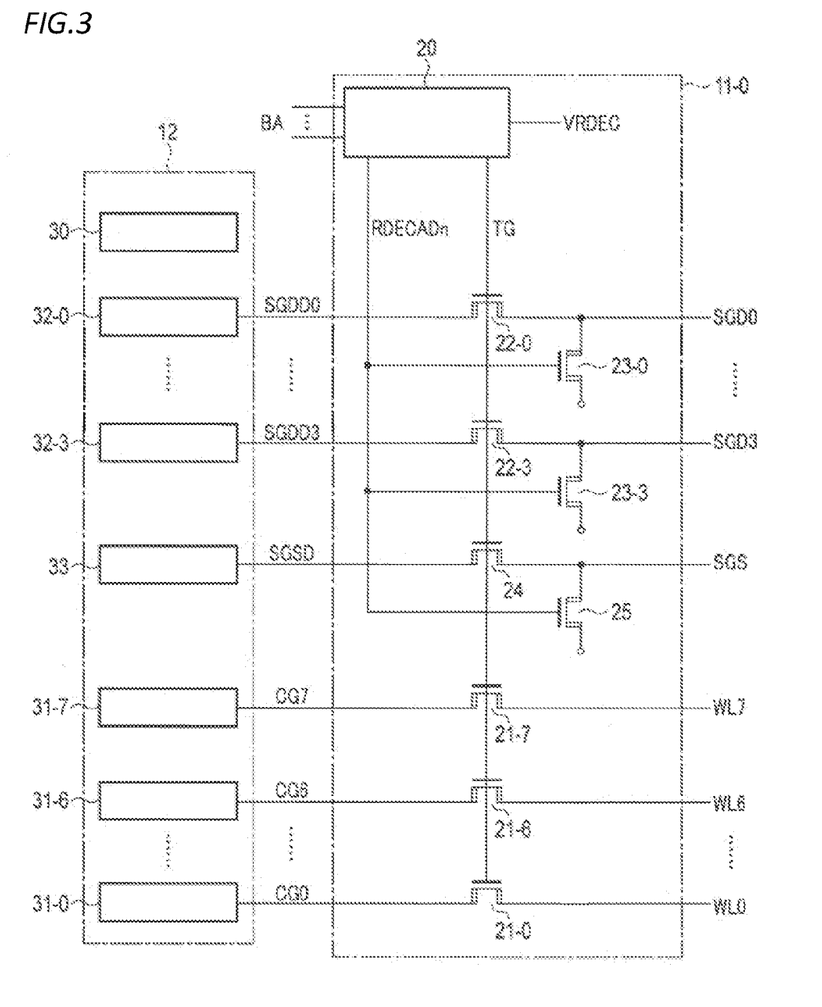
FIG. 3 is a block diagram of a row decoder and a driver circuit in the semiconductor device equipped with the level shifter of the first embodiment.

Next, the configuration of the row decoder 11 will be described with reference to FIG. 3. FIG. 3 shows the row decoder 11-0 and a driver circuit 12. The row decoders 11-1 to 11-3 are same as the row decoder 11-0.

The row decoder 11-0 includes a block decoder 20, high withstand voltage MOS transistors 21 (21-0 to 21-7), 22 (22-0 to 22-3), 23 (23-0 to 23-3), 24 and 25 each of which is enhancement type transistor and has n channel. The impurity density of a channel region of the transistor 25 for example is substantially same as those of transistors 21 to 24. The threshold voltage of the transistor 25 for example is substantially same as those of transistors 21 to 24.

The block decoder 20 decodes block address BA. The block decoder 20 decides logic levels of a signal line TG and a signal line RDECADn based on a result of decoding block address BA. The block decoder 20 controls these transistors 21 to 25 based on the logic levels.

During writing data, reading-out data, or erasing data of the memory cell transistors MT, if the block address BA corresponds to block BLK0, the block decoder outputs "H" level (a voltage VRDEC) to the signal line TG and "L" level (a ground voltage for example) to the signal line RDECADn. If the block address BA doesn't correspond to block BLK0, the block decoder outputs "L" level (a ground voltage for example) to the signal line TG and "H" level (a voltage which the transistors 23 and 25 turn on) to the signal line RDECADn. The voltage VRDEC is a voltage for turning on the transistors 21, 22, and 24. Therefore the driver circuit 12 outputs required voltages (a voltage applied to gates of the transistors 21, 22, and 24 plus a voltage corresponding to the threshold voltages of the transistors 21, 22, and 24) to the row decoder 11.

The transistors 21 (21-0 to 21-7) functions as switching elements which connect CG lines (CG0 to CG7) to word lines WL of the corresponding block BLK. First terminals of the transistors 21-0 to 21-7 are connected to word lines WL0 to WL7 of corresponding to the block BLK0, respectively. Second terminals of the transistors 21-0 to 21-7 are connected to the CG lines CG0 to CG7 respectively. Furthermore, the gates of the transistors 21-0 to 21-7 are commonly connected to the signal line TG.

The transistors 22 (22-0 to 22-3) functions as switching elements which connect SGDD lines (SGDD0 to SGDD3) to select gate lines SGD of the corresponding block BLK. First terminals of the transistors 22-0 to 22-3 are connected to the select gate lines SGD0 to SGD3 of corresponding to the block BLK0, respectively. Second terminals of the transistors 22-0 to 22-3 are connected to the SGDD lines SGDD0 to SGDD3 respectively. Furthermore, the gates of the transistors 22-0 to 22-3 are commonly connected to the signal line TG.

The transistors 23 (23-0 to 23-3) functions as switching elements which connect a ground voltage (Vss) line for example to select gate lines SGD of the corresponding block BLK. First terminals of the transistors 23-0 to 23-3 are connected to the select gate lines SGD0 to SGD3 of corresponding to the block BLK0, respectively. Second terminals of the transistors 22-0 to 22-3 are connected to the ground voltage line, respectively. Furthermore, the gates of the transistors 23-0 to 23-3 are commonly connected to the signal line RDECADn.

The transistor 24 functions as switching elements which connect a line SGSD to select gate lines SGS of the corresponding block BLK. A first terminal of the transistor 24 is connected to the select gate lines SGS of corresponding to the block BLK0. A second terminal of the transistor 24 is connected to a SGSD line SGSD. Furthermore, the gate of the transistor 24 is connected to the signal line TG.

The transistor 25 functions as switching elements which connect the ground voltage line for example to select gate lines SGS of the corresponding block BLK. A first terminal of the transistor 25 is connected to the select gate lines SGS of corresponding to the block BLK0. A second terminal of the transistor 25 is connected to the ground voltage line. Furthermore, the gate of the transistor 25 is connected to the signal line RDECADn.

If a logic level of the signal line TG is "H" level and a logic level of the signal line RDECADn is "L" level, the transistors 21, 22, and 24 will turn on. The transistors 23 and 25 will turn off. Therefore the word lines WL0 to WL7 are connected to the CG lines CG0 to CG7 respectively. The select gate lines SGD0 to SGD3 are connected to the SGDD lines SGDD0 to SGDD3 respectively. The select gate line SGS is connected to the SGSD line SGSD. If a logic level of the signal line TG is "L" level and a logic level of the signal line RDECADn is "H" level, the transistors 21, 22, and 24 will turn off. The transistors 23 and 25 will turn on. Therefore the word lines WL0 to WL7 are disconnected from the CG lines CG0 to CG7 respectively. The select gate lines SGD0 to SGD3, SGS are connected to the ground voltage line.

1.4 with Respect to Configuration of the Driver Circuit 12

Next, the configuration of the driver circuit 12 will be described with reference to FIG. 3. The driver circuit 12 transfers required voltages for writing data, reading out data, erasing data to the CG lines CG0 to CG7, the SGDD lines SGDD0 to SGDD3, SGSD line for example. As shown in FIG. 3, the driver circuit 12 includes a voltage driver 30. CG drivers 31 (31-0 to 31-7), SGD drivers 32 (32-0 to 32-3), and an SGS driver 33.

The voltage driver 30 transfers voltages for the block decoder 20 and the CG drivers for example.

The CG drivers 31 (31-0 to 31-7) transfer required voltages to the CG lines CG0 to CG7 respectively. During writing data, a CG driver corresponding to a selected word line WL transfers a program voltage VPGM to a CG line corresponding to the selected word line WL. The program voltage VPGM is applied to the selected word line WL during writing date. The CG drivers corresponding to unselected word lines WL transfers voltages VPASS to CG lines corresponding to the unselected word lines WL. The voltages VPASS are voltages which are applied to a non-selected word line WL during writing data, and allow the memory cell transistor MT to enter an on-state. The program voltage VPGM is higher than the voltages VPASS. During wading out data, a CG driver corresponding to a selected word line WL transfers a voltage VCGRV to a CG line corresponding to the selected word line WL. The voltage VCGRV is applied to the selected word line WL during reading out data accordingly based on levels of the data. The CG drivers corresponding to unselected word lines WL transfers voltage VREAD to CG lines corresponding to the unselected word lines WL. The voltage VREAD is voltage which is applied to a non-selected word line WL during reading out data, and allow the memory cell transistor MT to enter an on-state. The voltage VCGRV is lower than voltage VREAD.

The SGD drivers 32 (32-0 to 32-3) transfer required voltages to the SGDD lines (SGDD0 to SGDD3). For example, the SGD drivers 32 corresponding to a selected select gate line SGD transfer a voltage VSGD to a selected SGDD line during reading out data. The select transistor ST1 will turn on by applying the voltage VSGD to a gate of the select transistor ST1.

The SGS driver 33 transfers required voltages to the SGSD lines SGSD. For example, the SGS driver 33 corresponding to a selected block BLK transfers a voltage VSGS to a selected SGSD line during reading out data. The select transistor ST2 will turn on by applying the voltage VSGS to a gate of the select transistor ST2. The SGS driver 33 transfers the ground voltage (Vss) to the SGSD line.

1.5 with Respect to Configuration of the Voltage Driver 30

Figure 4:
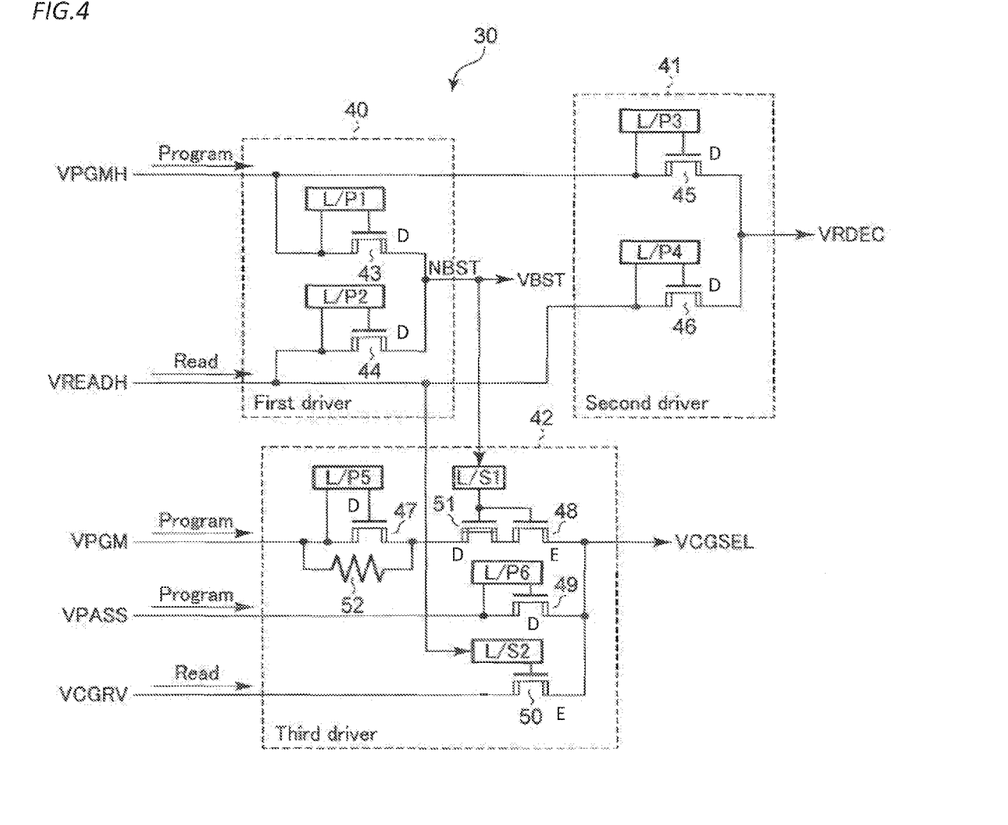
FIG. 4 is a block diagram of the driver circuit in the semiconductor device equipped with the level shifter of the first embodiment.

Next, the configuration of the voltage driver 30 will be described with reference to FIG. 4. FIG. 4 is a circuit diagram of the driver circuit 30. As shown in FIG. 4, the voltage driver 30 includes first to third drivers 40 to 42. The first driver 40 includes high withstand voltage MOS transistors 43, 44, a first local pump circuit L/P1, and a second local pump circuit L/P2. Each of these transistors 43, 44 has n channel.

A first terminal of the transistor 43 is connected to the first local pump circuit L/P1. A voltage VPGMH corresponding to the voltage VPGM is applied to the first terminal of the transistor 43 during writing data. The voltage VPGMH is higher than the voltage VPGM and is supplied from the voltage generation circuit 15. A gate of the transistor 43 is connected to an output of the first local pump circuit L/P1. The first local pump circuit L/P1 boosts a voltage applied to the first terminal of the transistor 43 and outputs voltage to the gate of the transistor 43. If a threshold voltage of the transistor 43 is defined as Vth43, the first local pump circuit L/P1 will apply voltage which is higher than "the voltage VPGMH+the voltage Vth 43" to the gate of the transistor 43 when the voltage VPGMH is applied to the first terminal of the transistor 43 during writing data.

A first terminal of the transistor 44 is connected to the second local pump circuit L/P2. A voltage VREADH corresponding to the voltage VREAD is applied to the first terminal of the transistor 44 during reading out data. The voltage VREADH is higher than the voltage VREAD and is supplied from the voltage generation circuit 15. A gate of the transistor 44 is connected to an output of the second local pump circuit L/P2. If a threshold voltage of the transistor 44 is defined as Vth44, the second local pump circuit L/P2 will apply voltage which is higher than "the voltage VREADH+ the voltage Vth 44" to the gate of the transistor 44 when the voltage VREADH is applied to the first terminal of the transistor 44 during reading out data. A second terminal of the transistor 43 is connected to a second terminal of the transistor 44 via a node NBST. A voltage VBST is output from the node NB ST.

The first driver 40 outputs the voltage VPGMH as the voltage VBST during writing data, since the transistor 43 will turn on. The first driver 40 outputs the voltage VREADH as the voltage VBST during reading out data, since the transistor 44 will turn on.

Next the configuration of the second driver 41 will be described. The second driver 41 includes high withstand voltage MOS transistors 45, 46, a third local pump circuit L/P3, and a fourth local pump circuit L/P4. Each of these transistors 45, 46 has n channel. A first terminal of the transistor 45 is connected to the third local pump circuit L/P3. A voltage VPGMH corresponding to the voltage VPGM is applied to the first terminal of the transistor 45 during writing data. A gate of the transistor 45 is connected to an output of the third local pump circuit L/P3. If a threshold voltage of the transistor 45 is defined as Vth45, the third local pump circuit L/P3 will apply voltage which is higher than "the voltage VPGMH+the voltage Vth 45" to the gate of the transistor 45 during writing data.

A first terminal of the transistor 46 is connected to the fourth local pump circuit L/P4. A voltage VREADH is applied to the first terminal of the transistor 46 during reading out data. A gate of the transistor 46 is connected to an output of the fourth local pump circuit L/P4. If a threshold voltage of the transistor 46 is defined as Vth46, the fourth local pump circuit L/P4 will apply voltage which is higher than "the voltage VREADH+the voltage Vth 46" to the gate of the transistor 46 during reading out data. A second terminal of the transistor 45 is connected to a second terminal of the transistor 46. A voltage VRDEC is output from a connection node between the second terminals of the transistors 45 and 46.

The second driver 41 outputs the voltage VPGMH as the voltage VRDEC during writing data, since the transistor 45 will turn on. The second driver 41 outputs the voltage VREADH as the voltage VRDEC during reading out data, since the transistor 46 will turn on.

Next the configuration of the third driver 42 will be described. The third driver 42 includes high withstand voltage MOS transistors 47 to 51, a resistance element 52, a fifth local pump circuit L/P5, a sixth local pump circuit L/P6, a first level shifter L/S1, and a second level shifter L/S2. These transistors 47 to 50 are enhancement type transistors. The transistor 51 is a depleted type transistor. Each of these transistors 47 to 51 has n channel.

A first terminal of the transistor 47 is connected to the fifth local pump circuit L/P5. A voltage VPGM is applied to the first terminal of the transistor 47 during writing data. A gate of the transistor 47 is connected to an output of the fifth local pump circuit L/P5. If a threshold voltage of the transistor 47 is defined as Vth47, the fifth local pump circuit L/P5 will apply voltage which is higher than "the voltage VPGM+the voltage Vth 47" to the gate of the transistor 47 during writing data.

A first terminal of the transistor 51 is connected to the second terminal of the transistor 47. A second terminal of the transistor 51 is connected to a first terminal of the transistor 48. Gates of the transistors 51 and 48 are connected to an output of the first level shifter L/S1. The first level shifter L/S1 outputs the voltage VBST accordingly based on a signal of the control circuit 16 during writing data for example.

A first terminal of the transistor 49 is connected to the sixth local pump circuit L/P6. The voltage VPASS is applied to the first terminal of the transistor 49 during writing data. A gate of the transistor 49 is connected to an output of the sixth local pump circuit L/P6. If a threshold voltage of the transistor 49 is defined as Vth49, the sixth local pump circuit L/P6 will apply voltage which is higher than "the voltage VPASS+the voltage Vth 49" to the gate of the transistor 49 during writing data.

A first terminal of the transistor 50 is connected to the second level shifter L/S2. The voltage VCGRV is applied to the first terminal of the transistor 50 during reading out data. A gate of the transistor 50 is connected to an output of the second level shifter L/S2. The second level shifter L/S2 receives the voltage VREADH from the voltage generation circuit 15 during reading out data and outputs required voltages to the gate of the transistor 50.

A first terminal of the resistance element 52 is connected to the first terminal of the transistor 47. A second terminal of the resistance element 52 is connected to a second terminal of the transistor 47.

Second terminals of the transistors 48 to 50 are commonly connected to the source line. A voltage VCGSEL is output from the connection node of the second terminals of the transistors 48 to 50. The voltage VCGRV is applied to a selected word line WL via the CG driver 31 during reading out data. The third driver 42 outputs the program voltage VPGM or the voltage VPASS during writing data, and outputs the voltage VCGRV during reading out data.

1.6 with Respect to Configuration of the First Level Shifter L/S1

Figure 5:
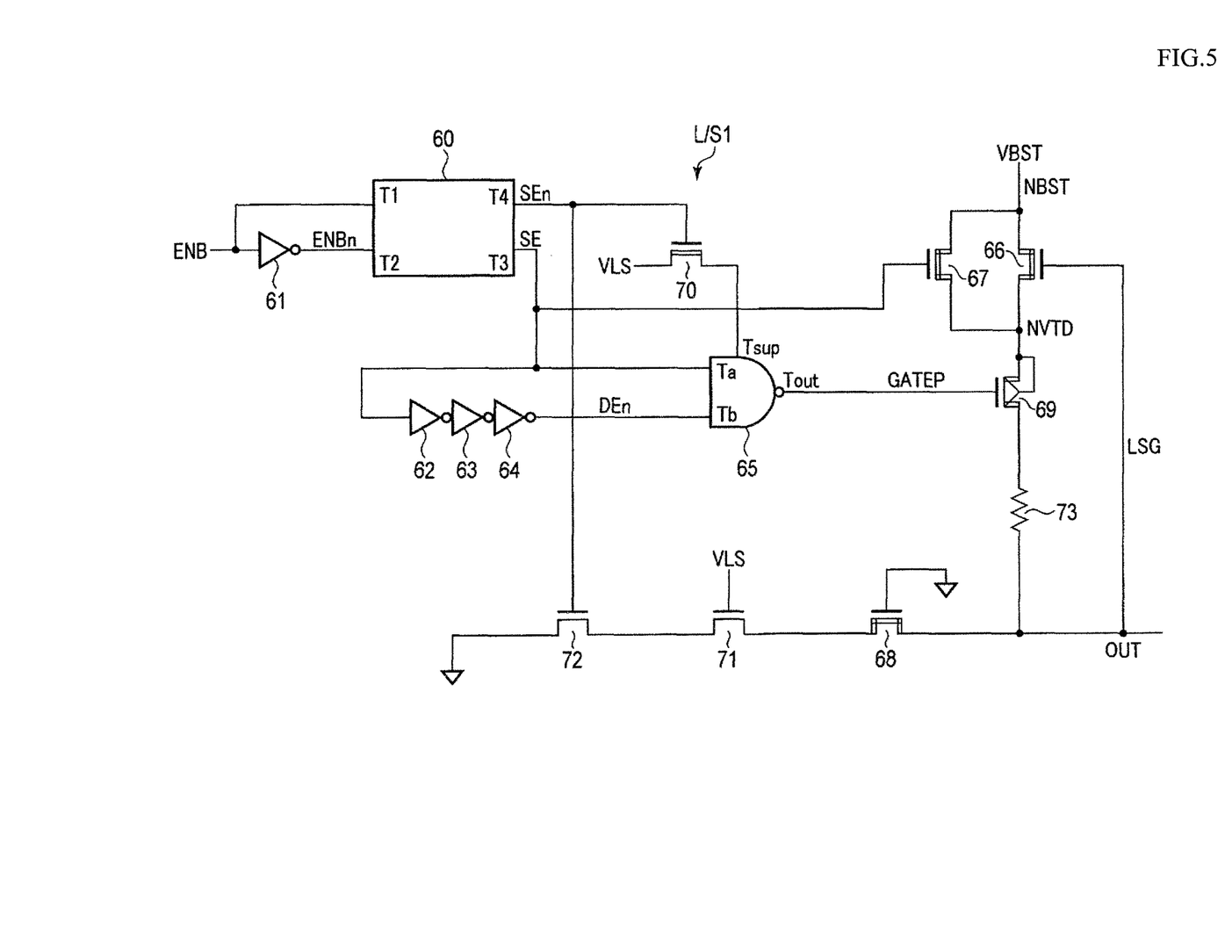
FIG. 5 is a circuit diagram of the level shifter of the first embodiment.

Next, the configuration of the first level shifter L/S1 will be described with reference to FIG. 5. FIG. 5 is a circuit diagram of the first level shifter driver circuit 30. As shown in FIGS., the first level shifter L/S1 includes a level shifter 60, inverters 61 to 64, NAND circuit 65, high withstand voltage MOS transistors 66 to 69, low withstand voltage MOS transistors 70 to 72. The transistors 66 to 70 are depleted type transistors. The transistors 71 and 72 are enhancement type transistors. Each of the transistors 66 to 68, 70 to 72 has n channel, and the transistor 69 has p channel.

A first input terminal T1 of the level shifter 60 receives a signal ENB from the control circuit 16, and a second input terminal T2 of the level shifter 60 receives an inverted signal ENBn of the signal ENB via the invertor 61. The signal ENB is a control signal of the first level shifter L/S1. For example, a logic level of the signal ENB is "H" level when the program voltage VPGM is applied to the selected word line during writing data. The level shifter 60 outputs a signal SE to a first output terminal T3. The signal SE is generated based on the signal ENB. The level shifter 60 outputs an inverted signal SEn to the second terminal T4. The inverted signal SEn is generated based on the signal ENBn.

If a logic level of the signal ENB is "L" level and a logic level of the signal ENBn is "H" level, the level shifter 60 outputs the ground voltage Vss ("L" level) as the signal SE, and outputs a voltage VEB ("H" level) as the signal Sen. The voltage VEB is higher than the ground voltage Vss. If a logic level of the signal ENB is "H" level and a logic level of the signal ENBn is "L" level, the level shifter 60 outputs the voltage VEB ("H" level) as the signal SE, and outputs the ground voltage Vss ("L" level) as the signal SEn.

A voltage VLS is applied to a first terminal of the transistor 70. The second terminal of the transistor 70 is connected to an input terminal Tsup (supply terminal) of the NAND circuit 65. If a threshold voltage of the transistor 70 is defined as "−Vth70" which is less than the ground voltage, the voltage VLS is higher than the voltage Vth70. The voltage VLS is supplied by the voltage generation circuit 15. A gate of the transistor 70 receives a signal Sen. The transistor 70 controls voltage which is transferred to the NAND circuit 65 based on the signal SEn.

If a logic level of the signal SEn is "L" level, the ground voltage is applied to the gate of the transistor 70. Since the transistor 70 is depleted type transistor, transistor 70 will turn on. The transistor 70 will transfer a voltage VRX (=the ground voltage Vss+Vth70) as the voltage Vsup to the NAND circuit 65. The voltage VRX is lower than the voltage VLS. If a logic level of the signal SEn is "H" level, the voltage VEB is applied to the gate of the transistor 70.

The transistor 70 will transfer a voltage VLS as the voltage Vsup to the NAND circuit 65. The voltage VEB is higher than "the voltage VLS−Vth70".

The signal SE is input to a second input terminal Ta of the NAND circuit 65. A signal Den is input to a third input terminal Tb of the NAND circuit 65 via three invertors 62 to 64 which are connected in series. The signal Den is an inverted signal of the signal SE. NAND circuit 65 outputs a signal GATEP from an output terminal Tout. The three invertors 62 to 64 functions not only to invert the signal SE but also to delay the signal. That is, the three invertors 62 to 64 is a kind of the delay circuit.

If a logic level of the signal SE is "L" level, the "L" level signal is input to the second terminal Ta of NAND circuit 65. "H" level signal is input to the third terminal Tb of the NAND circuit 65. Therefore NAND circuit 65 outputs "H" level as the signal GATEP. If the logic level of the signal SE is changed from "L" level to "H" level, the signal Den maintains "H" level during a delay period D1 of the invertors 62 to 64. The output of NAND circuit 65 changes to "L" level and stays "L" level during the delay period D1. After the delay period D1, the signal Den is changed from "H" level to "L" level and the output of the NAND circuit 65, signal GATEP, will then change to "H" level. In this embodiment, there are three invertors which are connected to the third input terminal Tb, but the number of the inverters may be an odd number and are not limited to three. Further, the number of inverters can be arbitrarily set based on the delay period.

A first terminal of the transistor 66 is connected to a node NBST. A voltage VBST is applied to the first terminal of the transistor 66. A second terminal of the transistor 66 is connected to a node NVTD. A gate of the transistor 66 is connected to a node LSG. The node LSG is connected to the gate of the transistor 66 and an output terminal OUT of the first level shifter L/S1. The transistor 66 controls the voltage VBST based on the voltage Vout of the output terminal of the first level shifter L/S1.

A first terminal of the transistor 67 is connected to a node NBST. A voltage VBST is applied to the first terminal of the transistor 67. A second terminal of the transistor 67 is connected to a node NVTD. The signal SE is applied to a gate of the transistor 67. If threshold voltages of the transistors 66 and 67 are defined as "−Vthd" which is less than the ground voltage VSS, if a logic level of the signal SE is "H" level (a voltage VEB) and a voltage of the node NVTD is lower than "VEB+Vthd", the transistor 67 will turn on. Therefore a voltage of the node NVTD will be boosted up to a voltage "VEB+Vthd"

A second terminal and back gate of the transistor 69 are connected to the node NVTD. A first terminal of the transistor 69 is connected to a first terminal of a resistance 73. The signal GATEP is applied to a gate of the transistor 69. If a logic level of the signal is "L" level, the transistor 69 will turn on. The transistor 69 functions as a transfer gate which transfers the voltage VBST to the output terminal OUT. A second terminal of the resistance 73 is connected to the output terminal OUT of the first level shifter L/S1 and a first terminal of the transistor 68.

A second terminal of the transistor 68 is connected to the first terminal of the transistor 71. A gate of the transistor 68 is connected to the ground voltage VSS. Since the transistor 68 is depleted type transistor, the transistor 68 will turn on even if the ground voltage is applied to a gate of the transistor 68.

A second terminal of the transistor 71 is connected to the first terminal of the transistor 72. The voltage VLS is applied to a gate of the transistor 71. The voltage VLS is higher than a threshold voltage of the transistor 71. Therefore the transistor 71 normally turn on. A second terminal of the transistor 72 is connected to the ground voltage Vss. The signal SEn is applied to a gate of the transistor 72. If a logic level of the signal SEn is "H" level, the transistor 72 will turn on.

1.5 with Respect to Operation of the First Level Shifter L/S1

Figure 6:
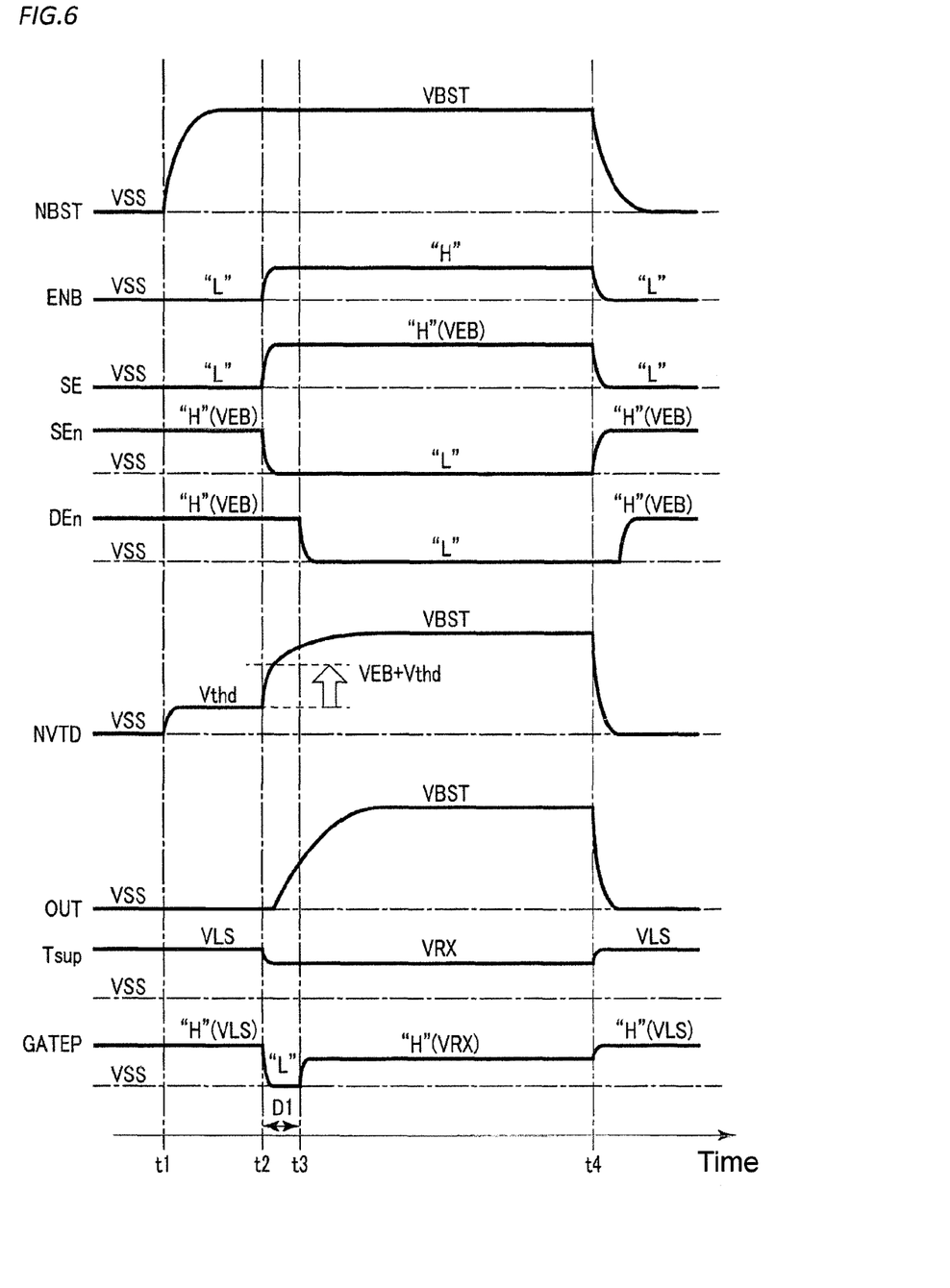
FIG. 6 is a timing chart which shows a plurality of signals and voltages in the level shifter of the first embodiment.

Next the operation of the first level shifter L/S1 will be described with reference to FIG. 6. FIG. 6 is a timing chart of lines of the first level shifter L/S1. As shown in FIG. 6, the first driver 40 in the voltage driver 30 applies the voltage VBST to the node NBST. The control circuit 16 will make the signal ENB "L" level. The signal SE will be "L" level (the ground voltage) based on the signal ENB. The signals SEn and Den will be "H" level.

The transistor 70 will transfer the voltage VLS to the first input terminal Tsup of the NAND circuit 65 because the voltage VEB is applied to the gate of the transistor 70. NAND circuit 65 outputs the voltage VLS as the signal GATEP since the voltage VLS is applied as a voltage supply. The transistor 69 will maintain off state during the voltage VLS is applied to the gate of the transistor 69.

Since the voltage VEB as the signal SEn is applied to the gate of the transistor 72, the transistor 72 will turn on. Since the transistors 68 and 71 will be on state, the output terminal OUT is connected to the ground voltage. Therefore the voltage of the output terminal OUT is the voltage Vss.

Since the transistors 66 and 67 are depleted type transistors, a voltage Vthd is applied to the node NVTD even if the ground voltage Vss (a voltage of the output terminal and the signal SE) is applied to the gate of the transistors 66 and 67. The voltage Vthd is less than the voltage VBST.

Next, at a time t2, the control circuit 16 will set a logic level of the signal ENB to "H" level. The level sifter 60 will set a logic level of the signal SE to "H" level (the voltage VEB) and set a logic level of the signal SEn to "L" level (the ground voltage). The signal Den maintains "H" level owing to the inverters 62 to 64. The transistor 72 turns off since the ground voltage is applied to the gate of the transistor 72. The transistor 70 transfers the voltage VRX to the first input terminal Tsup since the ground voltage is applied to the gate of the transistor 70. The NAND circuit 65 sets a logic level of the signal GATEP to "L" level (the ground voltage) since the siganls SE and DEn will be "H" level signals. Therefore the transistor 69 will be on state.

In that case, the voltage of the output terminal OUT will rise since the voltage of the node NVTD is transferred to the output terminal OUT. The voltage of the gate of the transistor 66 will rise, and the voltage of the node NVTD will be transferred much more via the transistor 66.

The transistor 67 will transfer the voltage "VEB+Vthd" to the node NVTD since the voltage VEB is applied to the gate of the transistor 67.

Next in the time t3, that is, the time t3 is a time after the lapse of the delay period D1 from the time t2, the signal Den will be inverted to "L" level. The NAND circuit 65 will set a logic level of the signal GATEP to "H" level. Since the voltage VRX is applied to the first input terminal Tsup of the NAND circuit 65, the NAND circuit 65 outputs the voltage VRX as the signal GATEP.

The voltage VRX is applied to the gate of the transistor 69. If a threshold voltage of the transistor 69 is defined as a voltage−Vth69, in case that a voltage of the node NVTD is higher than the voltage "VRX+Vth69", the transistor 69 will keep on-state. Voltages of the node NVTD and the output terminal OUT rise up to the voltage VBST. The voltage Vout at the time t3 is less than a voltage VBST-VRX. That is, the voltage difference between the gate and the second terminal of the transistor 69 does not exceed a voltage "VBST−VRX".

At a time t4, the first driver 40 stops outputting the voltage VBST. The control circuit 16 sets a logic level of the signal ENB to "L" level. The level shifter 60 sets a logic level of the signal SE to "L" level and sets a logic level of the signal SEn to "H" level based on the signal ENB. The signal Den will be "H" level after the delay period D1. The transistor 70 transfers the voltage VLS to the first input terminal of the NAND circuit 65 since the signal SEn is "H" level.

The NAND circuit 65 will set a logic level of the signal GATEP to "H" level since the power supply is a voltage VLS and a logic level of the signal SE is "H" level. That is, the voltage VLS is applied to the gate of the transistor 69. The transistor 72 will turn on since a logic level of the signal SEn is "H" level. Therefore the output terminal OUT is connected to the ground voltage.

Transistor 69 will turn off if the voltages of the output terminal OUT and the node NVTD is less than the voltage "VLS+Vth69".

3. Effects of this Embodiment

The level shifter of this embodiment can improve the reliability. In the semiconductor device (a comparative device), a plurality of voltages are used depending on the purpose. In order to transfer a necessary voltage, the level shifters which are composed of a P-channel MOS transistors for the transfer gate may be used in some cases. In such a level shifter, when high voltages are transferred, a high voltage difference between a gate and a second terminal (source) of the P-channel MOS transistor may occur. More specifically, for example, when a P-channel MOS transistor transfers 20 V voltage, if the ground voltage is applied to a gate of the transistor to turn on, a voltage difference of 20 V is applied. Therefore there is a possibility that the insulation resistance of the gate insulating film deteriorates. As a result, the P-channel MOS transistor may not control voltage which should be transferred (a comparative example).

But in this embodiment, the level shifter L/S1 includes the transistor 70 which controls the voltage supply of the NAND circuit 65 based on the signal SEn, the invertors 62 to 64 which outputs the signal Den to the third input terminal Tb of the NAND circuit 65, and the transistor 67 which transfers a voltage corresponding to the signal SE to the second terminal of the transistor 69, that is the node NVTD. The NAND circuit 65 will outputs "L" level as the signal GATEP during the delay period D1 if a logic level of the signal SE changes "L" level to "H" level. Then the NAND circuit 65 will outputs the voltage VRX as the signal GATEP while the signal SE is "H" level. If the voltage of the node NVTD is higher than the voltage "VRX+Vth69" during the delay period D1, the transistor 69 keeps on-state even if the voltage VRX is applied to the gate of the transistor 69. The transistor 69 can transfer the voltage VBST. A voltage difference between the gate and the second terminal of the transistor 69 is the voltage "VBST-VRX". Compared to the comparative example, the voltage difference between the gate and the second terminal of the transistor 69 decreases by the voltage VRX. Therefore, deterioration of the transistor 69 can be suppressed, and the reliability of the level shifter can be improved.

The transistor 67 will be on-state if a logic level of the signal SE is "H" level and the voltage of the node NVTD is less than the voltage "VEB (the gate voltage of the transistor 67)+Vthd (a threshold voltage of the transistor 67; −Vthd)". The transistor 67 can raise the voltage of the node NVTD to "VEB+Vthd" irrespective of the voltage Vout of the output terminal OUT. Therefore, by using the transistor 67, a rising rate of the voltage at the node NVTD can be faster than a case that only the transistor 66 is used. Therefore, if the voltage "VEB+Vthd" is higher than the voltage "VRX+Vth69", the transistor 67 can reliably set the voltage of the node NVTD to "VRX+Vth 69" or more during the delay period D1. Even if the voltage of the gate of the transistor 67 rises to the voltage VRX, the transistor 69 can transfer the voltage VBST without going into the off-state. The voltage difference between the gate and the second terminal of the transistor 69 can be reduced, and the reliability of the level shifter can be improved.

The NAND circuit 65 can output "H" level without being controlled by the control circuit 16 after outputting "L" level during the delay period D1. Further, the delay period D1 can be easily controlled by the number of inverters without using a counter or the like. Since it is unnecessary to complicate the circuit configuration of the control circuit 16 or to add a counter or the like, an increase in chip area can be suppressed.

4. Modification Embodiment of the Above Level Shifter

The above embodiment's level shifter includes a first circuit configured to generate a first signal, the first signal being inverted and delayed signal of a second signal, a NAND circuit including a first input terminal and a second input terminal, the second signal being input to the first terminal, the first signal being input to the second terminal, a first transistor, a first voltage being applied to a first terminal of the first transistor, a second terminal of the first transistor being connected to a third input terminal of the NAND circuit, a third signal which inverts the second signal being applied to a gate of the first transistor, a second transistor, a second voltage being applied to a first terminal of the second transistor, the second voltage being higher than the first signal, a gate of the second transistor being connected to an output terminal, a third transistor, the second voltage being applied to a first terminal of the third transistor, a second terminal of the third transistor being connected to a second terminal of the second transistor, the second signal being applied to a gate of the third transistor, and a fourth transistor, a first terminal of the fourth transistor being connected to the second terminal of the third transistor, a second terminal of the fourth transistor being connected to the output terminal, an output terminal of the NAND circuit being connected to a gate of the fourth transistor.

The above embodiment's level shifter can improve the reliability. The embodiments of this invention is not limited to the above described embodiment.

Figure 7:
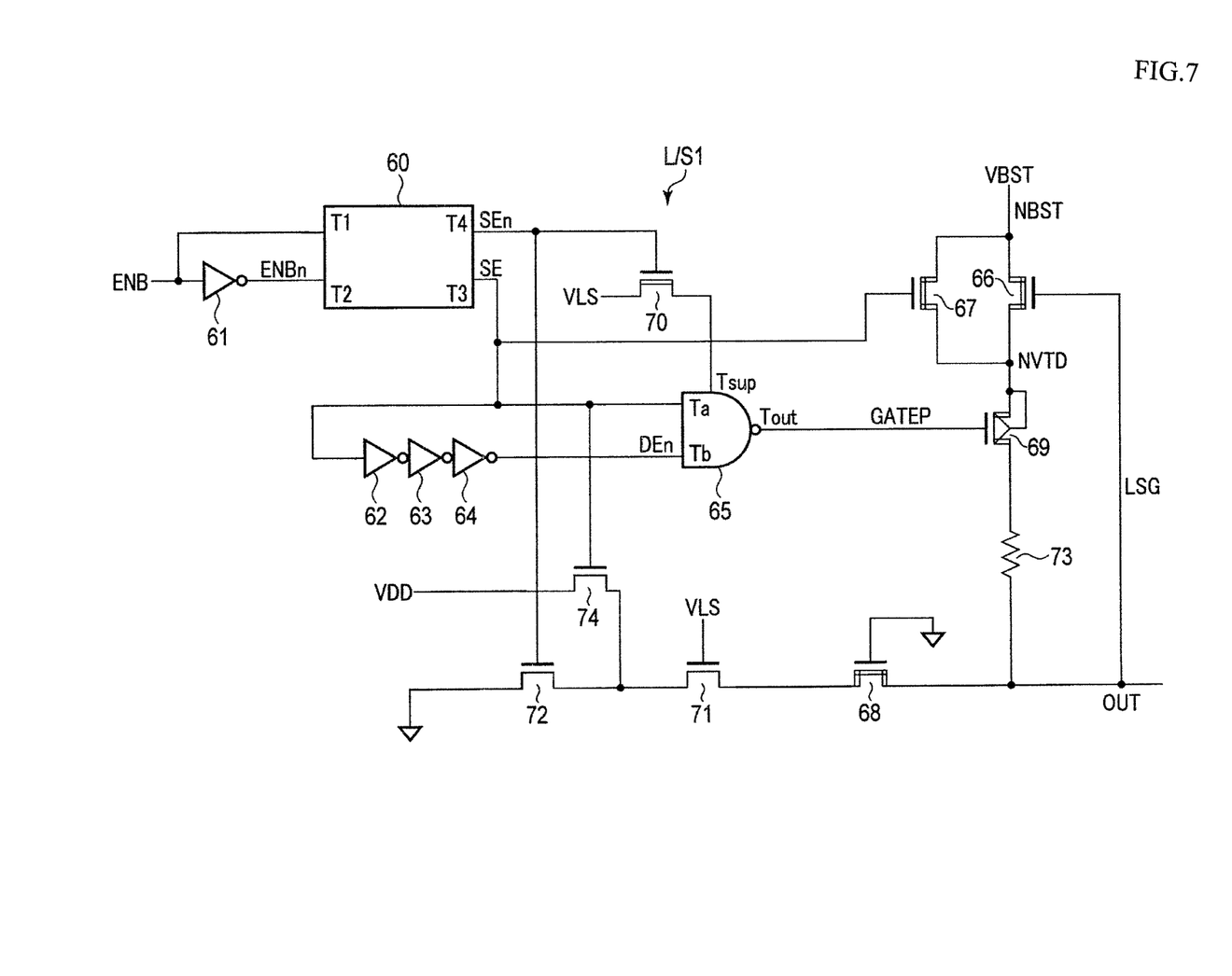
FIG. 7 is a circuit diagram of the level shifter which modifies the first embodiment.

For example, in the above embodiment, when the signal SE is "H" level, a transistor for applying the power supply VDD to the output terminal OUT of the first level shifter L/S1 may be provided. FIG. 7 shows the above modification. As shown in FIG. 7, the first level shifter L/S1 further includes an n channel enhancement type MOS transistor 74. A first terminal of the transistor 74 is connected to the first terminal of the transistor 71 and the second terminal of the transistor 72. A second terminal of the transistor 72 is connected to the power supply VDD. The signal SEn is applied to a gate of the transistor 74. When a logic level of the signal "SE" will be changed from the "L" level to the "H" level, the power supply VDD is applied to the output terminal OUT and the gate of the transistor 66. A rising rate of this modification embodiment is faster than that of the first embodiment.

The transistors 66 and 67 may be enhancement type transistors.

Furthermore, in the above embodiment, the case where the first level shifter L/S1 includes the level shifter 60 has been described, but it may be omitted. For example, the first level shifter L/S1 may receive the signals SE and SEn from the control circuit or the like.

The level shifter according to this embodiment also be applied to a three-dimensional stacked NAND flash memory or a planar NAND flash memory different from the above embodiment. Furthermore, the level shifter according to the present embodiment can be applied to a semiconductor device having a level shifter using a p-channel transistor as a transfer gate, without being limited to the NAND type flash memory.

In addition, for example, the "connection" in the above-described embodiments also includes an indirect connection state that is established through any member such as a transistor and a resistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Furthermore, in the respective embodiments, the following configuration may be employed. For example, when the memory cell transistor MT is capable of retaining two-bit (four-value) data, and when a threshold level during retention of any one of the four values is set as an E-level (erasure level), an A-level, a B-level, and a C-level from a lower side, the following configuration can be employed.

(1) In the read operation, for example, a voltage, which is applied to a word line selected for a read operation of the A-level, is in a range of 0 V to 0.55 V. The voltage may be set to any one of ranges of 0.1 V to 0.24 V, 0.21 V to 0.31 V, 0.31 V to 0.4 V, 0.4 V to 0.5 V, and 0.5 V to 0.55 V without limitation to the voltage range.

For example, a voltage, which is applied to a word line selected for a read operation of the B-level, is in a range of 1.5 V to 2.3 V. The voltage may be set to any one of ranges of 1.65 V to 1.8 V, 1.8 V to 1.95 V, 1.95 V to 2.1 V, and 2.1 V to 2.3 V without limitation to the voltage range.

For example, a voltage, which is applied to a word line selected for a read operation of the C-level, is in a range of 3.0 V to 4.0 V. The voltage may be set to any one of ranges of 3.0 V to 3.2 V, 3.2 V to 3.4 V, 3.4 V to 3.5 V, 3.5 V to 3.6 V, and 3.6 V to 4.0 V without limitation to the voltage range.

For example, read operation time (tR) may be set to a range of 25 μs to 38 μs, 38 is to 70 μs, or 70 μs to 80 μs.

(2) As described above, the write operation includes the programming operation and the verification operation. In the write operation, for example, a voltage, which is first applied to a word line selected during the programming operation, is in a range of 13.7 V to 14.3 V. For example, the voltage may be set to any one of ranges of 13.7 V to 14.0 V, and 14.0 V to 14.6 V without limitation to the voltage range.

A voltage that is first applied to a selected word line during a write operation to an odd-numbered word line, and a voltage that is first applied to a selected word line during a write operation to an even-numbered word line may be changed.

When setting the programming operation to an incremental step pulse program (ISPP) method, for example, a step-up voltage may be set to approximately 0.5 V.

For example, a voltage, which is applied to a non-selected word line, may be set to a range of 6.0 V to 7.3 V. For example, the voltage may be set to a range of 7.3 V to 8.4 V, or 6.0 V or less without limitation to the voltage range.

A pass voltage, which is applied, may be changed depending on whether or not the non-selected word line is an odd-numbered word line or an even-numbered word line.

For example, write operation time (tProg) may be set to a range of 1700 μs to 1800 μs, 1800 μs to 1900 μs, or 1900 μs to 2000 μs.

(3) In the erasing operation, for example, a voltage that is first applied to a well, which is formed on an upper side of the semiconductor substrate, and on which the memory cell is disposed on an upper side thereof, is in a range of 12 V to 13.6 V. For example, the voltage may be set to a range of 13.6 V to 14.8 V, 14.8 V to 19.0 V, 19.0 V to 19.8 V, or 19.8 V to 21 V without limitation to the voltage range.

For example, erasing operation time (tErase) may be set to a range of 3000 μs to 4000 μs, 4000 μs to 5000 μs, or 4000 μs to 9000 μs.

(4) With regard to the structure of the memory cell, a charge storage layer, which is disposed on the semiconductor substrate (silicon substrate) through a tunnel insulating film having a film thickness of 4 to 10 nm, is provided. The charge storage layer may be set to have a stacked structure including an insulating film such as SiN and SiON which have a film thickness of 2 to 3 nm, and a polysilicon having a film thickness of 3 to 8 nm. In addition, a metal such as Ru may be added to the polysilicon. In addition, an insulating film is provided on the charge storage layer. For example, the insulating film includes a silicon oxide film having a film thickness of 4 to 10 nm which is interposed between a lower-layer High-k film having a film thickness of 3 to 10 nm and an upper-layer High-k film having a film thickness of 3 to 10 nm. Examples of the High-k film include HfO and the like. In addition, the film thickness of the silicon oxide film may be set to be larger than the film thickness of the High-k film. A control electrode, which has a film thickness of 30 nm to 70 nm, is formed on the insulating film through a work function adjustment material having a film thickness of 3 to 10 nm. Here, examples of the work function adjustment material include a metal oxide film such as TaO, and a metal nitride film such as TaN. W and the like may be used for the control electrode.

In addition, an air gap may be formed between memory cells.

What is claimed is:

1. A flash memory driver circuit configured to supply voltages to a row decoder for writing and reading data, comprising:
   a control circuit configured to output a first signal having a first logic level at a first time and a second logic level, inverse of the first logic level, at a second time after the first time;
   a logic level shifter circuit connected to receive the first signal as an input and output a second signal to an output terminal responsive to the first signal; and a voltage driver circuit configured to controllably output a first voltage during a first operation and a second voltage during a second operation according to the second signal, wherein the logic level shifter circuit is configured to:
output the second signal at a third voltage at the first time,
output the second signal at a fourth voltage higher than the third voltage and lower than a fifth voltage between the second time and a third time, and
output the second signal at the fifth voltage after the third time according to a predetermined delay after the second time.

2. The flash memory driver circuit, according to claim 1, wherein the level shifter circuit further comprises:
a first circuit configured to generate a first signal, the first signal being inverted and delayed signal of a second signal;
a NAND circuit including a first input terminal and a second input terminal, the second signal being input to the first terminal, the first signal being input to the second terminal;
a first transistor, a first voltage being applied to a first terminal of the first transistor, a second terminal of the first transistor being connected to a third input terminal of the NAND circuit, a third signal which inverts the second signal being applied to a gate of the first transistor;
a second transistor, a second voltage being applied to a first terminal of the second transistor, the second voltage being higher than the first signal, a gate of the second transistor being connected to the output terminal;
a third transistor, the second voltage being applied to a first terminal of the third transistor, a second terminal of the third transistor being connected to a second terminal of the second transistor, the second signal being applied to a gate of the third transistor; and
a fourth transistor, a first terminal of the fourth transistor being connected to the second terminal of the third transistor, a second terminal of the fourth transistor being connected to the output terminal, an output terminal of the NAND circuit being connected to a gate of the fourth transistor.

3. The flash memory driver circuit according to claim 2, wherein the first to third transistors are n channel depleted type MOS transistors, and the fourth transistor is p channel enhancement type MOS transistors.

4. The flash memory driver circuit according to claim 2, further comprising:
a second circuit configured to output the first and third signal accordingly based on a fourth signal and a fifth signal, the fourth signal being input from outside, the fifth signal being inverted signal of the fourth signal.

5. The flash memory driver circuit according to claim 3, further comprising:
a second circuit configured to output the first and third signal accordingly based on a fourth signal and a fifth signal, the fourth signal being input from outside, the fifth signal being inverted signal of the fourth signal.

6. The flash memory driver circuit according to claim 2, further comprising:
fifth to seventh transistors, a first terminal of the fifth transistor being connected to the output terminal, a gate of the fifth transistor being connected to a ground voltage, a first terminal of the sixth transistor being connected to a second terminal of the fifth transistor, a second terminal of the sixth transistor being connected to a first terminal of the seventh transistor, the first voltage being applied to a gate of the sixth transistor, a second terminal of the seventh transistor being connected to the ground voltage.

7. The flash memory driver circuit according to claim 3, further comprising:
fifth to seventh transistors, a first terminal of the fifth transistor being connected to the output terminal, a gate of the fifth transistor being connected to a ground voltage, a first terminal of the sixth transistor being connected to a second terminal of the fifth transistor, a second terminal of the sixth transistor being connected to a first terminal of the seventh transistor, the first voltage being applied to a gate of the sixth transistor, a second terminal of the seventh transistor being connected to the ground voltage.

8. The flash memory driver circuit according to claim 5, further comprising:
fifth to seventh transistors, a first terminal of the fifth transistor being connected to the output terminal, a gate of the fifth transistor being connected to a ground voltage, a first terminal of the sixth transistor being connected to a second terminal of the fifth transistor, a second terminal of the sixth transistor being connected to a first terminal of the seventh transistor, the first voltage being applied to a gate of the sixth transistor, a second terminal of the seventh transistor being connected to the ground voltage.

9. The flash memory driver circuit according to claim 7, wherein the fifth transistor is n channel depleted type MOS transistor, and the sixth and seventh transistors are n channel enhancement type MOS transistors.

10. The flash memory driver circuit according to claim 8, wherein the fifth transistor is n channel depleted type MOS transistor, and the sixth and seventh transistors are n channel enhancement type MOS transistors.

11. The flash memory driver circuit according to claim 9, further comprising:
an eighth transistor, a first terminal of the eighth transistor being connected to the second terminal of the sixth transistor, the third voltage being applied to a second terminal of the eighth transistor, the first voltage being applied to a gate of the eighth transistor.

12. The flash memory driver circuit according to claim 10, further comprising:
an eighth transistor, a first terminal of the eighth transistor being connected to the second terminal of the sixth transistor, the third voltage being applied to a second terminal of the eighth transistor, the first voltage being applied to a gate of the eighth transistor.

* * * * *